United States Patent [19]
Cargill

[11] Patent Number: 6,163,198
[45] Date of Patent: Dec. 19, 2000

[54] LOG-LINEAR VARIABLE GAIN AMPLIFIERS AND AMPLIFIER CONTROL APPARATUS AND METHODS

[75] Inventor: Robert S. Cargill, Portland, Oreg.

[73] Assignee: Maxim Integrated Products, Inc., Sunnyvale, Calif.

[21] Appl. No.: 09/360,602

[22] Filed: Jul. 26, 1999

[51] Int. Cl.$^7$ .................................................. G06F 7/556
[52] U.S. Cl. .......................................... 327/350; 327/362
[58] Field of Search .................................... 327/350, 351, 327/352, 346, 362; 330/254, 256

[56] References Cited

U.S. PATENT DOCUMENTS

| | | | |
|---|---|---|---|
| 5,570,055 | 10/1996 | Gilbert | 327/350 |
| 5,572,166 | 11/1996 | Gilbert | 330/254 |
| 5,610,547 | 3/1997 | Koyama et al. | 327/350 |
| 5,672,961 | 9/1997 | Entrikin et al. | 323/315 |
| 5,677,561 | 10/1997 | Jensen | 257/469 |
| 5,684,431 | 11/1997 | Gilbert et al. | 330/254 |
| 5,748,027 | 5/1998 | Cargill | 327/350 |

*Primary Examiner*—Tuan T. Lam
*Assistant Examiner*—Hiep Nguyen
*Attorney, Agent, or Firm*—Blakely, Sokoloff, Taylor & Zafman LLP

[57] ABSTRACT

Log-linear variable gain amplifiers and amplifier control apparatus and methods providing temperature compensated log-linear gain characteristics with a wide range of control for a current steered variable gain amplifier. The invention provides the sum of scaled linear and exponential terms, proportional to absolute temperature and responsive to an input control voltage. The sum of these terms is applied to a current steered variable gain amplifier to provide the desired log-linear variable gain control. Various embodiments are disclosed.

18 Claims, 6 Drawing Sheets

Difference between output characteristic for three forms
a) Vagc = Vt*(c2*Vin + c3*exp(c4*Vin))
b) Vagc = Vt*(c2*Vin + c3*Vin*exp(c4*Vin))
c) ideal linear-in-dB

LOG-LINEAR VARIABLE GAIN AMPLIFIERS AND AMPLIFIER CONTROL APPARATUS AND METHODS

BACKGROUND OF THE INVENTION

1. Field of the Invention

The present invention relates to the field of variable gain amplifiers and the control thereof.

2. Prior Art

Many applications require a variable gain amplifier with a gain versus control voltage characteristic that is log-linear. Such control characteristic, often also referred to by other names, may be characterized by a gain control characteristic wherein the output of the gain controlled amplifier in db is a substantially linear function of the gain control voltage, preferably over as much of the gain control range of the amplifier as possible.

One prior art gain control method includes a control loop that is difficult to stabilize. A simpler prior art variable gain amplifier is a transconducter loaded with a pair of devices operated as a current steering mechanism, but generating a log-linear characteristic with this variable gain amplifier has not been demonstrated. By way of example, U.S. Pat. No. 5,572,166 discloses a Linear-In-Decibel Variable Gain Amplifier for an RF signal variable gain amplifier, though the technique disclosed therein is not applicable to current steered variable gain amplifiers.

BRIEF SUMMARY OF THE INVENTION

Log-linear variable gain amplifiers and amplifier control apparatus and methods providing temperature compensated log-linear gain characteristics with a wide range of control for a current steered variable gain amplifier. The invention provides the sum of scaled linear and exponential terms, proportional to absolute temperature and responsive to an input control voltage. The sum of these terms is applied to a current steered variable gain amplifier to provide the desired log-linear variable gain control. Various embodiments are disclosed.

DETAILED DESCRIPTION OF THE PREFERRED EMBODIMENT

In the description to follow, for purposes of explanation, base currents are assumed to be small in comparison to emitter and collector currents. In accordance with this assumption, the emitter and collector currents of each transistor are assumed to be equal and the currents through two transistors connected in series are assumed to be equal, or at least unaffected by any transistor base connections there between.

Figure 1:
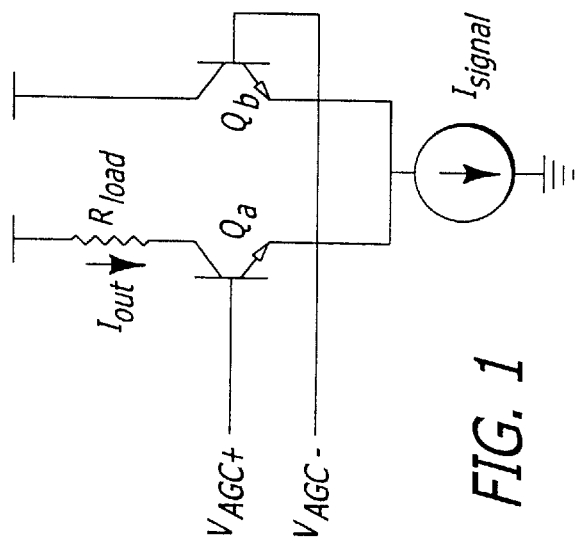
FIG. 1 is a schematic representation of a current steered variable gain amplifier (VGA).

First referring to FIG. 1, a simple current steered variable gain amplifier may be seen. In this Figure, transistors $Q_a$ and $Q_b$ steer components of the signal current $I_{signal}$ through the load resistor $R_{load}$, and directly to the power supply, in a ratio dependent on the differential gain control voltage $V_{AGC+} - V_{AGC-}$, also referred to hereinafter simply as $V_{AGC}$ for convenience. To provide the desired log-linear characteristic, it is desired that the current $I_{OUT}$ through the load resistor be related to a gain control voltage $V_{IN}$ generally in accordance with the equation:

$$I_{OUT} = I_{signal} C_1 e^{C_2 V_{IN}}$$

where:
$C_1$ and $C_2$ are constants

To obtain this characteristic, the correct relationship between $V_{AGC}$ and $V_{IN}$ must be used.

For a differential bipolar transistor pair having a tail current $I_{tail}$, the collector current $I_{OUT}$ of one of the pair will be:

$$I_{OUT} = \frac{I_{tail}}{2}\left(1 + \tanh\frac{V_{AGC}}{V_T}\right)$$

where:
VT=the thermal voltage (kT/q)
k=Boltzmann's constant
T=absolute temperature
q=the electron charge Thus, assuming a unity tail current, the desired log-linear characteristic will be obtained if:

$$\frac{1}{2}\left(1 + \tanh\frac{V_{AGC}}{2V_T}\right) = C_1 e^{C_2 V_{IN}}$$

or:

$$\tanh\frac{V_{AGC}}{2V_T} = 2C_1 e^{C_2 V_{IN}} - 1$$

where $$\tanh\frac{V_{AGC}}{2V_T} \text{ ranges from } -1 \text{ to } 1$$

($I_{OUT}$ ranges from 0 to $I_{tail}$)

If $x^2 < 1$:

$$\tanh^{-1} x = \frac{1}{2}\ln\left(\frac{1+x}{1-x}\right)$$

Since $(2C_1 e^{C_2 V_{IN}} - 1)^2 < 1$ $$\frac{V_{AGC}}{2V_T} = \frac{1}{2}\ln\left(\frac{2C_1 e^{C_2 V_{IN}}}{2 - 2C_1 e^{C_2 V_{IN}}}\right) = \frac{1}{2}\ln\frac{C_1 e^{C_2 V_{IN}}}{1 - C_1 e^{C_2 V_{IN}}}$$

Therefore:
$V_{AGC} = V_T (\ln C_1 e^{C_2 V_{IN}} - \ln(1 - C_1 e^{C_2 V_{IN}}))$
Or:
$V_{AGC} = V_T (\ln C_1 + C_2 V_{IN} - \ln(1 - C_1 e^{C_2 V_{IN}}))$ Using the expansion $\ln(1+z) = z - \frac{1}{2}z^2 + \frac{1}{3}z^3 - \frac{1}{4}z^4 + \ldots$, two regions are noted. First, when $V_{IN}$ is small, $C_1 e^{C_2 V_{IN}} \ll 1$ so that:

$V_{AGC} \cong V_T (\ln C_1 + C_2 V_{IN} - \ln(1)) = V_T(\ln C_1 + C_2 V_{IN})$

Under these conditions, $V_{AGC}$ is proportional to absolute temperature and has a linear dependence on the input $V_{IN}$.

When $V_{IN}$ is large, the term $\ln(1 - C_1 e^{C_2 V_{IN}})$ dominates, so that:

$V_{AGC} \cong (-\ln(1 - C_1 \ e^{C_2 V_{IN}})) \cong V_T(-(-C_3 \ e^{C_4 V_{IN}})) = V_T \ C_3 e^{C_4 V_{IN}}$ where: $C_3$ and $C_4$ are constants Under these conditions, $V_{AGC}$ is proportional to absolute temperature and has an exponential dependence on the input $V_{IN}$.

The combined effect is:

$V_{AGC} \cong V_T(\ln C_1 + C_2 V_{IN} + C_3 \ e^{C_4 V_{IN}})$

Consequently, the desired log-linear characteristic for a simple current steered variable gain amplifier can be obtained if the gain control voltage can be made to vary with the gain control input voltage $V_{IN}$ as follows:

$V_{AGC} \cong V_T(C_2 V_{IN} + C_3 \ e^{C_4 V_{IN}})$

Figure 2:
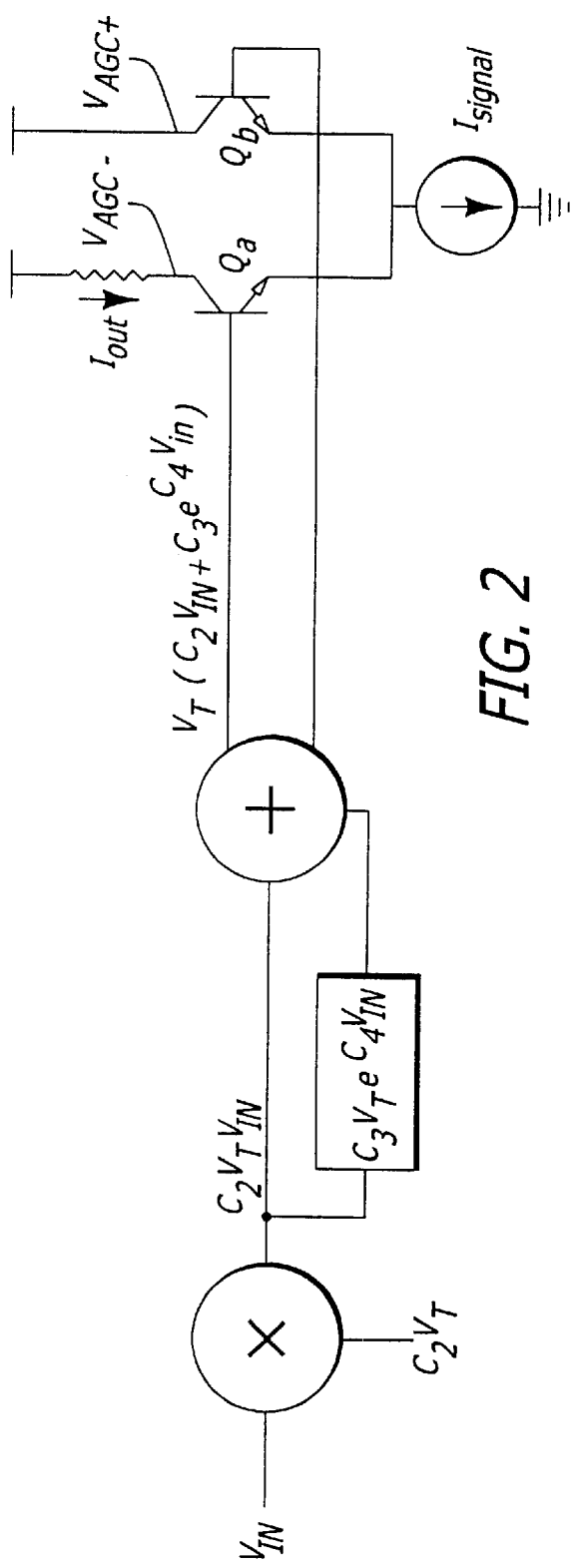
FIG. 2 is a schematic representation of one form of log-linear control of a current steered variable gain amplifier (VGA) in accordance with the present invention.

Now referring to FIG. 2, a diagram illustrating the general principles of one embodiment of the invention may be seen. As illustrated therein, an input signal $V_{IN}$, which is the automatic gain control voltage, is multiplied by $C_2 V_T$. The result, $C_2 V_T V_{IN}$, is applied to a PTAT (proportional to absolute temperature) exponential generator $f(x) = cV_T e^x$, where C is also a constant, and added to itself to provide a differential steering voltage, referred to as the gain control voltage $V_{AGC}$ of:

$V_{AGC} = V_T(C_2 V_{IN} + C_3 e^{C_4 V_{IN}})$  Eq.(1)

Figure 3:
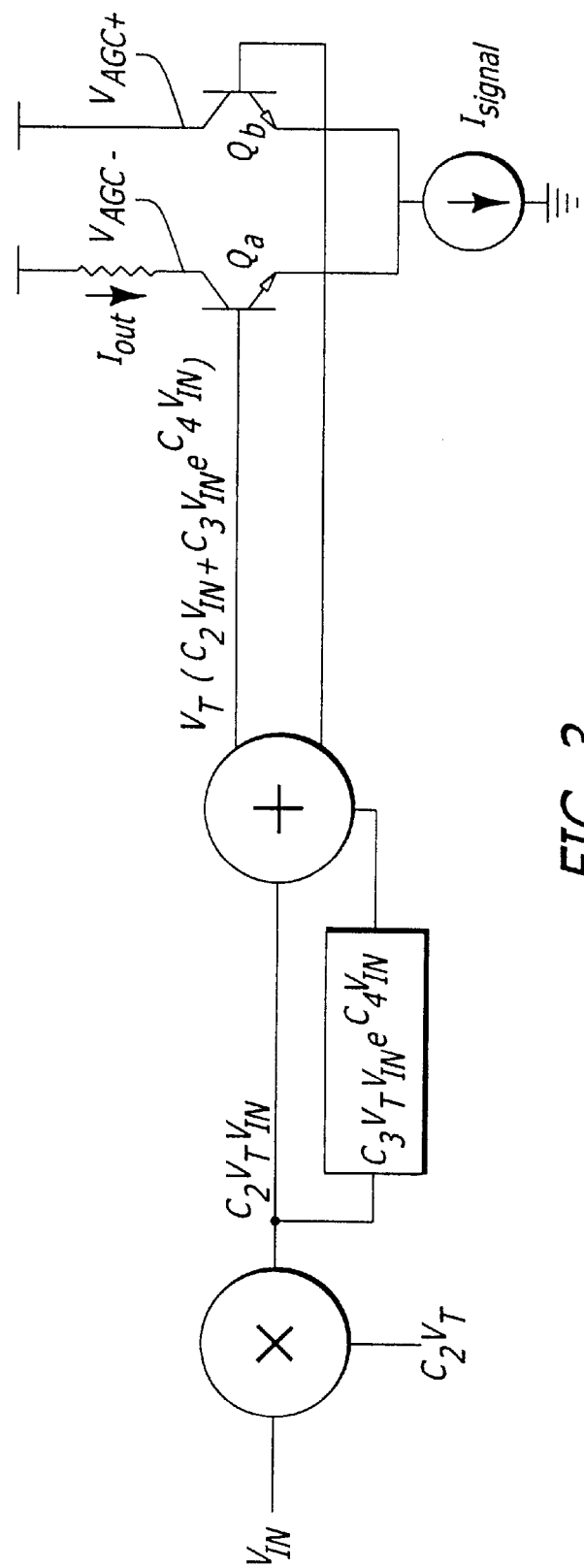
FIG. 3 is a schematic representation of one form of log-linear control of a current steered variable gain amplifier (VGA) in accordance with the present invention.

FIG. 3 is a diagram illustrating the general principles of another embodiment of the invention. As illustrated therein, an input signal $V_{IN}$, the automatic gain control voltage, is multiplied by $C_2 V_T$. The result, $C_2 V_T V_{IN}$, is applied to a PTAT exponential generator $f(x) = cxV_T e^x$ and added to itself to provide a differential steering voltage or gain control voltage $V_{AGC}$ of:

$V_{AGC} = V_T(C_2 V_{IN} + C_3 V_{IN} e^{C_4 V_{IN}})$  Eq.(2)

(Typically, $C_3$ and $C_4$ are not the same as in Eq. (1).)

Figure 4:
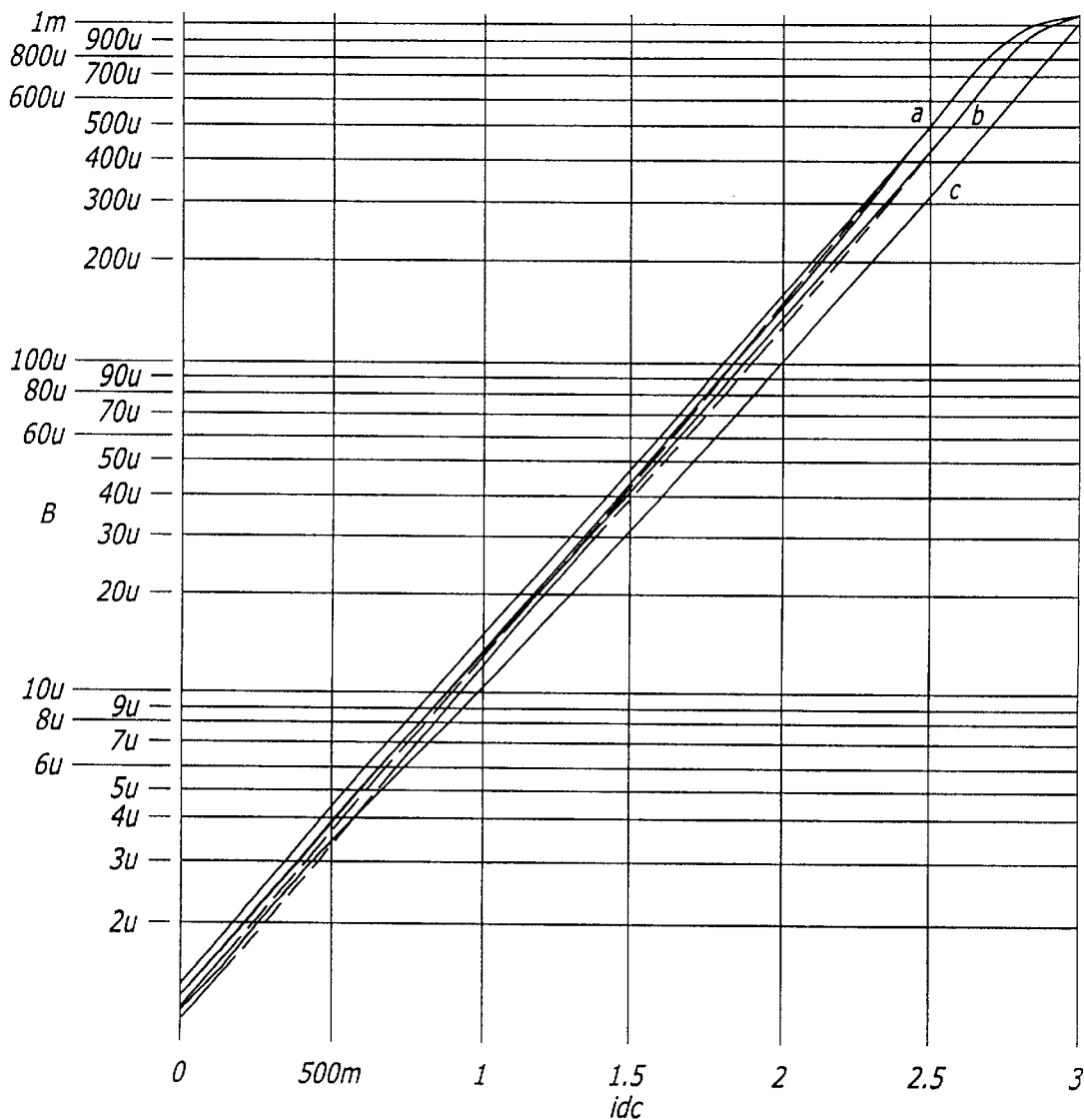
FIG. 4 presents plots showing the log-linear characteristics of first and second embodiments of the present invention and an ideal log-linear or linear-in-dB characteristic.

FIG. 4 presents plots showing the result of simulations of $V_{AGC} = V_T(C_2 V_{IN} + C_3 e^{C_4 V_{IN}})$ (curve a), $V_{AGC} = V_T(C_2 V_{IN} + C_3 V_{IN} e^{C_4 V_{IN}})$ (curve b) and an ideal log-linear or linear-in-db characteristic (curve c). The dashed lines for curves a and b represent corresponding simulations for various operating temperatures. It can be seen that curves a (Eq. 1) and b (Eq. 2) both behave well over the temperature range and closely follow an ideal log-linear curve, deviating significantly from the ideal only at the upper end of the gain control range.

Figure 5:
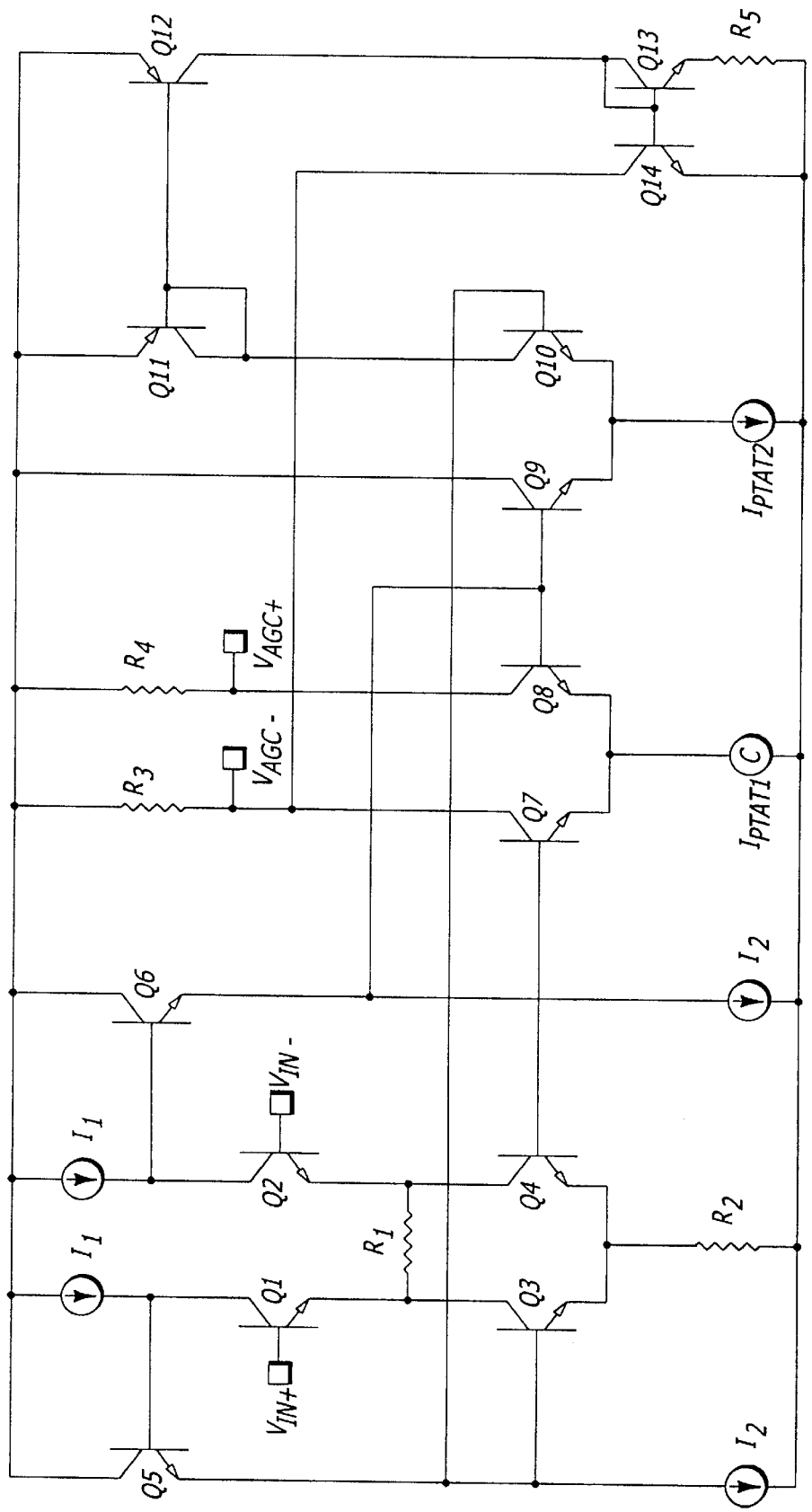
FIG. 5 is a circuit diagram for an exemplary circuit implementing one embodiment of the present invention.

Now referring to FIG. 5, a circuit diagram for one embodiment of the present invention may be seen, namely Equation 2 above and curve b of FIG. 4. As shown in FIG. 5, the differential automatic gain control voltage $V_{IN}$ (actually $V_{IN+} - V_{IN-}$) is provided to the bases of transistors Q1 and Q2, with the collector voltages of transistors Q7 and Q8 providing the gain control voltage $V_{AGC}$ ($V_{AGC+} - V_{AGC-}$) to provide the current steering control for the current steered variable gain amplifier (see FIG. 1). In the circuit shown in FIG. 5, current sources $I_1$ provide equal currents through transistors Q1 and Q2, as well as base current to transistors Q5 and Q6, which are biased into conduction by current sources $I_2$ and provide base currents for transistors Q3 and Q4, respectively. When the input voltage $V_{IN}$ is zero ($V_{IN+} - V_{IN-} = 0$), the emitters of transistors Q1 and Q2 are at the same voltage so that no current flows through resistor $R_1$. Accordingly, current $I_1$ flows through each of transistors Q3 and Q4, with the current through resistor $R_2$ being $2I_1$.

Under this condition, transistors Q3 and Q4 will conduct equally, so that the base voltages of these two transistors are equal. These base voltages are coupled to transistors Q8 and Q7, respectively, which in turn will equally conduct, namely, each conducting one half of the current of current source $I_{PTAT1}$, a current source proportional to absolute temperature, typically of the type well known in the prior art.

When the input voltage $V_{IN}$ is not zero, the voltage of the emitters of transistors Q1 and Q2 will follow the change in the differential input voltages $V_{IN+}$ and $V_{IN-}$, so that the voltage across resistor $R_1$ will equal $V_{IN}$. Consequently, the current through resistor $R_1$ will be $V_{IN}/R_1$. The currents through transistors Q3 and Q4, while still totaling $2I_1$, will be unequal by the amount $V_{IN}/R_1$, or $I_{Q4} - I_{Q3} = V_{IN}/R_1$. Accordingly, the combination of transistors Q5 and Q6 and current sources $I_2$ will adjust the base voltages of transistors Q3 and Q4 to provide for this unequal division of currents in transistors Q3 and Q4, and more particularly to provide for the resulting ratio in currents in transistors Q3 and Q4, namely:

$$\frac{I_{Q3}}{I_{Q4}} = \frac{I_1 - \frac{V_{IN}}{2R_1}}{I_1 + \frac{V_{IN}}{2R_1}}$$

These base voltages are, in turn, directly coupled to transistors Q8 and Q7, respectively, so that the ratio of collector currents $I_{Q8}/I_{Q7}$ is the same as the ratio of collector currents $I_{Q3}/I_{Q4}$. The magnitude of the collector currents of transistors Q7 and Q8, however, is proportional to absolute temperature, as the sum of the two currents must equal the proportional to absolute temperature current of the current source $I_{PTAT1}$. Therefore the difference in collector currents in transistors Q8 and Q7 is proportional to the product of the input voltage $V_{IN}$ times a current proportional to absolute temperature. Consequently, there is a component of differential current through resistors $R_4$ and $R_3$, and thus a component in the differential gain control voltage $V_{AGC}$, equal to the product of the input voltage $V_{IN}$ and absolute temperature. This corresponds to the first term in the equation for the differential gain control voltage $V_{AGC}$ (Eq. 1), namely, $V_T C_2 V_{IN}$ (a term proportional to the product of absolute temperature and the input voltage $V_{IN}$). (See U.S. Pat. No. 5,672,961, owned by Maxim Integrated Products, Inc., assignee of the present invention.)

The base voltages on transistors Q3 and Q4 are also applied to the bases of transistors Q9 and Q10. While in the embodiment being described, other pairs of transistors are the same size, transistor Q9 is N times larger than transistor Q10, such as by way of but one example, 9 times larger than transistor Q10. Accordingly, when the input signal $V_{IN}$ is zero, 90% of the tail current of current source $I_{PTAT2}$ will flow through transistor Q9, with only 10% of that tail current flowing through transistor Q10 and being mirrored by transistors Q11 and Q12 to transistor Q13 and resistor $R_5$. As the input voltage $V_{IN}$ increases, however, the conduction of transistor Q9 will be reduced and the conduction of transistor Q10 increased, so that a larger percentage of the tail current of transistors Q9 and Q10 flows through transistor Q10. Thus, a primary and desired effect of the different areas of transistors Q9 and Q10 is to skew the division of the tail current of the current source $I_{PTAT2}$ between transistors Q9 and Q10 in comparison to the division of tail current between transistors Q7 and Q8 from current source $I_{PTAT1}$. Another effect of the area difference in transistors Q9 and Q10 is to make the change in current in the collector of transistor Q10 a somewhat nonlinear function of the input voltage $V_{IN}$. This nonlinear effect is not excessive in the desired operating range of the circuit of FIG. 3, so that for purposes of explanation hereafter, the variable component in the collector current $I_{Q10}$ of transistor Q10 will be assumed to be directly proportional to the input voltage $V_{IN}$. The nonlinear effect has been found to itself approach an exponential term, and therefore could itself be used to provide one of the terms added to simulate the overall log-linear control. In the circuit being described, the nonlinear effect primarily only effects the selection of circuit parameters to closely achieve the desired log-linear curve shape.

As stated before, the current $I_{Q10}$ is mirrored by transistors Q11 and Q12 to transistor Q13 and resistor $R_5$. For transistors Q13 and Q14:

$$V_{BE14} - V_{BE13} = I_{Q13}R_5 = I_{Q10}R_5$$

Assuming transistors Q13 and Q14 are the same size:

$$V_{BE14} - V_{BE13} = V_T \ln(I_{Q14}/I_{Q13}) = I_{Q10}R_5$$

or, since $I_{Q13} = I_{Q10}$:

$$\ln(I_{Q14}/I_{Q10}) = I_{Q10}R_5/V_T$$
$$I_{Q14} = I_{Q10}e^{I_{Q10}R_5/V_T}$$

Since $I_{Q10}$ is approximately proportional to the product of absolute temperature and the input voltage ($I_{Q10} \propto CV_{IN}V_T$), $I_{Q14}$ can be expressed as:

$$I_{Q14} \approx CV_{IN}V_T e^{CV_{IN}}$$

The current $I_{Q14}$ is coupled to the resistor $R_3$, adding to the gain control voltage $V_{AGC}$, a component:

$$I_{Q14}R_3 \approx R_3 CV_{IN}V_T e^{CV_{IN}}$$

Thus, by proper selection of the various parameters determining the coefficients, the gain control voltage $V_{AGC}$ can be made to have the desired function of the input voltage $V_{IN}$:

$$V_{AGC} = V_T(C_2 V_{IN} + C_3 V_{IN} e^{C_4 V_{IN}}) \qquad \text{Eq.(2)}$$

Figure 6:
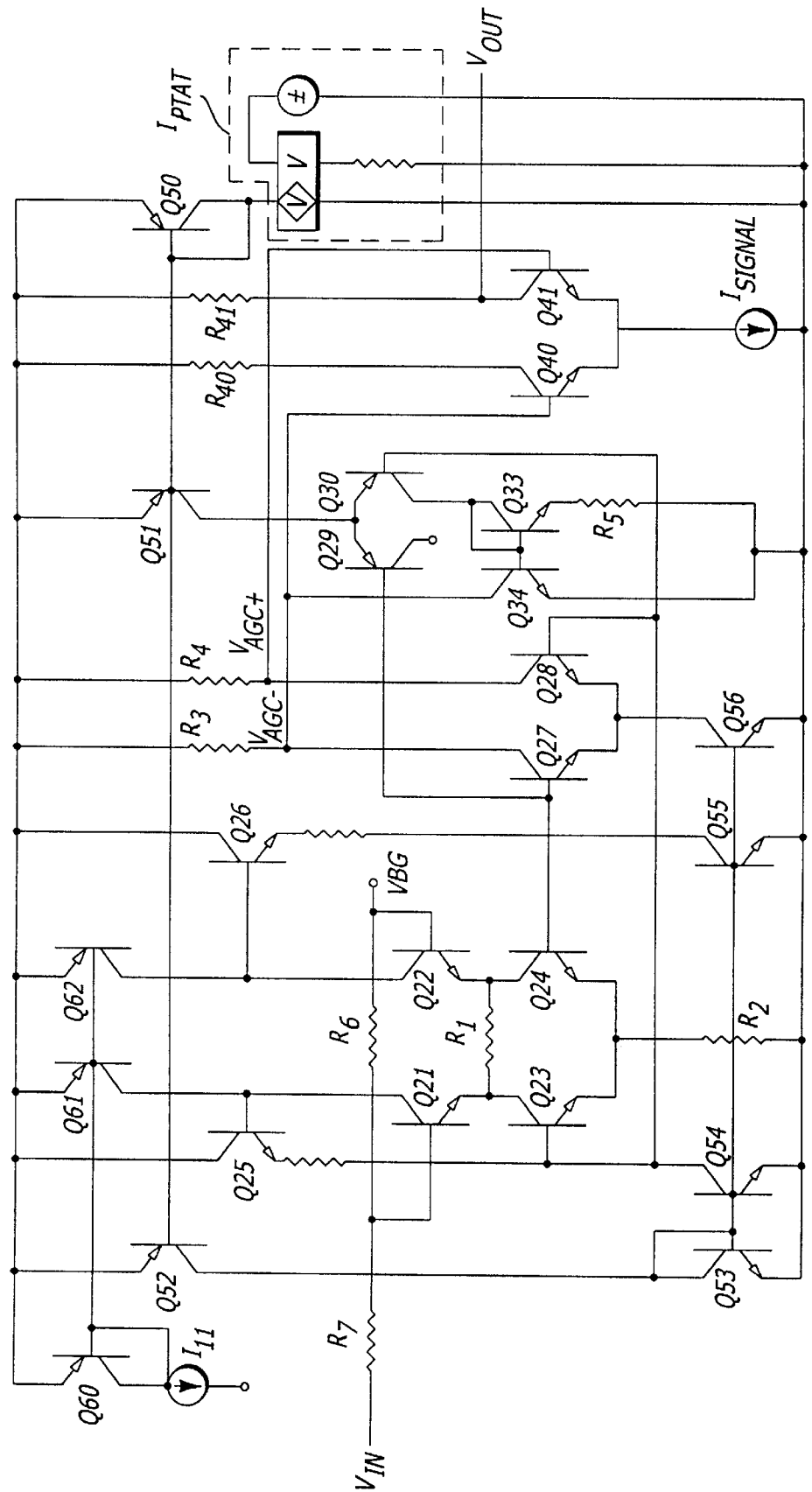
FIG. 6 is a circuit diagram for another exemplary circuit implementing the embodiment of the present invention similar to that of FIG. 5.

Now referring to FIG. 6, a further embodiment having characteristics generally in accordance with equation 2 may be seen. In this embodiment, transistors Q21 through Q28 function basically as described with respect to transistors Q1 through Q8 of FIG. 5. Also, resistors $R_1$ through $R_5$ function in the same manner as resistors $R_1$ through $R_5$ in FIG. 5. In the circuit of FIG. 6, current source $I_{PTAT}$ provides a current to diode-connected transistor Q50, which mirrors the current to transistors Q51 and Q52. The current through transistor Q52 also passes through diode-connected transistor 53, which mirrors the current to transistors Q54, Q55 and Q56. The current mirrored to transistor Q51 is functionally equivalent to the current of current source $I_{PTAT2}$ of FIG. 5, though as shall be subsequently described, that portion of the circuit of FIG. 6 is somewhat different from the corresponding portion of the circuit of FIG. 5. The current through transistors Q52 and Q53, mirrored to transistors Q54 and Q55, is equivalent to current sources $I_2$ of FIG. 5. Finally, the current proportional to absolute temperature mirrored to transistor Q56 corresponds to $I_{PTAT1}$ of FIG. 5. Similarly, current source $I_{11}$ provides current to diode-connected transistor Q60, which mirrors the same to transistor Q61 and Q62, acting as the equivalent of current sources $I_1$ in the circuit of FIG. 5. Also in the circuit of FIG. 6, the input voltage $V_{IN}$ is single-ended, the voltage VBG being a bandgap reference voltage. Resistors $R_6$ and $R_7$ set the input impedance and the scale factor of the transfer function of the circuit, with resistor $R_6$ converting from a single-ended input to a differential signal, with a common mode input component matching the input common mode range of transistors Q21 and Q22.

In the circuit of FIG. 6, transistors Q29 and Q30 provide the function of transistors Q9 and Q10 of FIG. 5. However, transistors Q29 and Q30 are pnp transistors, with the collector current of transistor Q30 being directly connected to transistor Q33, transistors Q33 and Q34 together with resistor $R_5$ providing the function of transistors Q13 and Q14 and resistor $R_5$ of FIG. 5. The use of pnp transistors for transistors Q29 and Q30, in comparison to the npn transistors Q9 and Q10 of FIG. 5, avoids the need for the current mirror of transistors Q11 and Q12 of FIG. 5.

Also shown in FIG. 6, in addition to a circuit functionally equivalent to the circuit of FIG. 5, is a current steered variable gain amplifier comprising resistors $R_{40}$ and $R_{41}$, transistors Q40 and Q41 and, of course, the signal current source $I_{signal}$. The ratio $V_{OUT}/I_{signal}$ closely approximates the desired log-linear response to the input voltage $V_{IN}$. In that regard, the voltage on the collector of transistor Q41 has an increasing response or gain in response to increasing input voltages $V_{IN}$, though if the opposite effect is desired, the desired log-linear output may instead be taken from the collector of transistor Q40.

Figure 7:
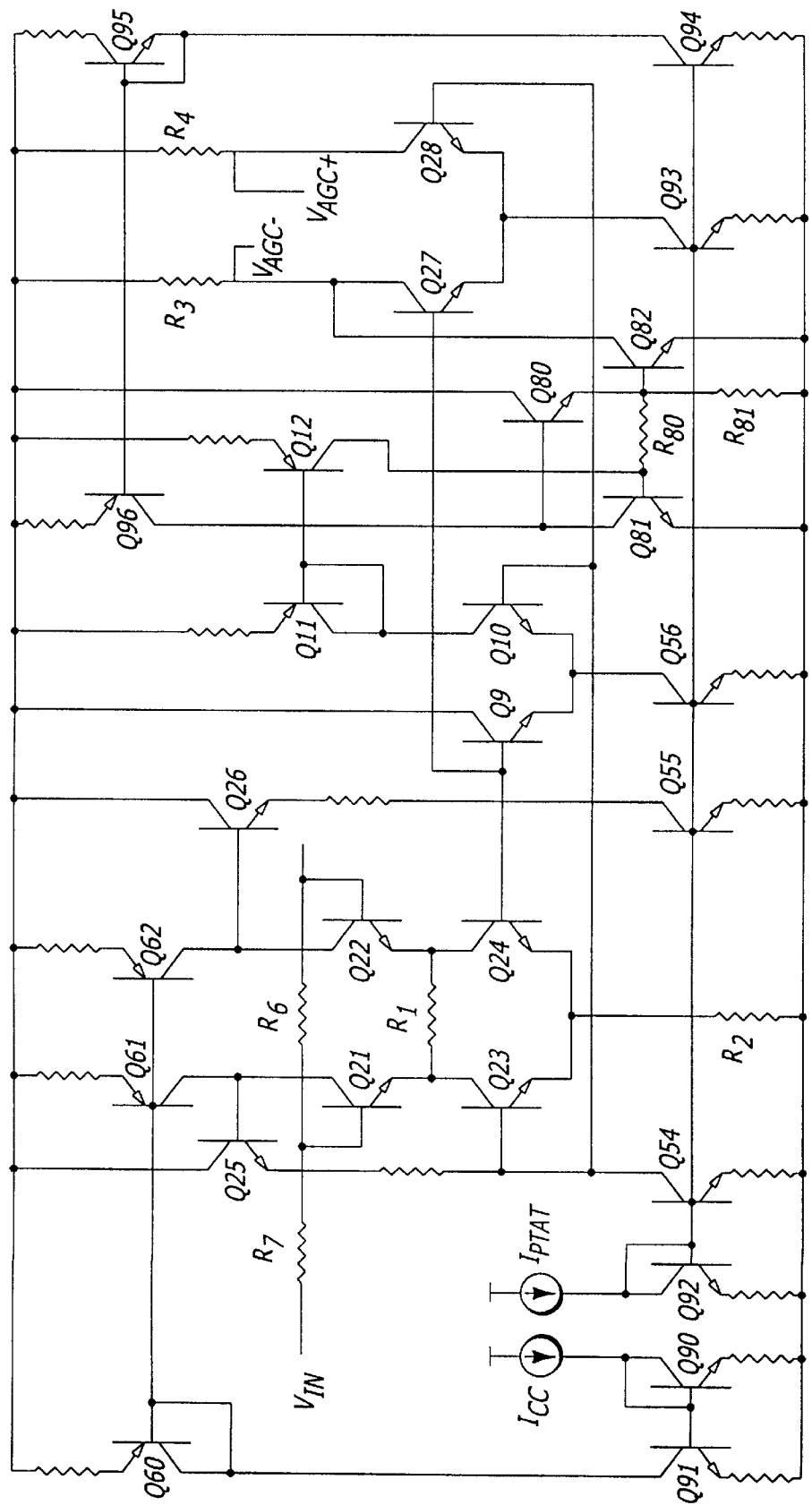
FIG. 7 is a circuit diagram for an exemplary circuit implementing another embodiment of the present invention.

Now referring to FIG. 7, an embodiment of the invention implementing equation 1 may be seen. In this circuit, transistors Q21 through Q28 and resistors $R_1$ through $R_4$, like those of FIG. 6, provide the same function as transistor Q1 through Q8 and resistors $R_1$ through $R_4$ of FIG. 5. Resistors $R_6$ and $R_7$ provide the same function as the resistors $R_6$ and $R_7$ of FIG. 6. In addition, transistors Q60, Q61 and Q62 perform the same function as transistors Q60, Q61 and Q62 in FIG. 6, the current through transistor Q60 of FIG. 7 being mirrored by transistors Q90 and Q91 from a current source $I_{CC}$. Similarly, transistors Q54, Q55 and Q56 function the same as corresponding transistors in FIG. 6, current being mirrored thereto by transistor Q92 from a current source $I_{PTAT}$ proportional to absolute temperature. Resistors $R_6$ and $R_7$ correspond to the same resistors of FIG. 6.

The current $I_{PTAT}$ through transistor Q92 is mirrored to transistor Q93, equivalent to transistor Q56 of FIG. 6 and current source $I_{PTAT1}$ of FIG. 5. The current through transistor Q92 is also mirrored to transistor Q94, with diode-connected transistor Q95 connected thereto, mirroring the current to transistor Q96 so that the current in transistor Q81 is proportional to absolute temperature. The current in transistor Q12, mirrored from transistor Q11, is approximately proportional to the product of absolute temperature and the input voltage $V_{IN}$, biased however, with respect to the input voltage $V_{IN}$ because of the area ratio of transistors Q9 and Q10.

The circuit comprised of transistors Q80, Q81 and Q82, and resistors $R_{80}$ and $R_{81}$ may be analyzed as follows. First consider the theoretical condition of zero collector current in transistor Q12. Transistor Q80 will provide a current through resistor $R_{81}$ to provide an adequate voltage on the bases of transistors Q81 and Q82 so that transistor Q81 will conduct the current proportional to absolute temperature provided thereto as mirrored to transistor Q96. Because the base currents in transistors Q81 and Q82 are assumed to be zero, the voltage drop across resistor $R_{80}$ will be zero so that the bases of transistors Q81 and Q82 are of the same voltage. Now with an actual current in the collector of transistor Q12, that current will flow through resistor $R_{80}$ and through resistor $R_{81}$ to ground (decreasing the current through transistor Q80, which is only a biasing transistor anyway). Consequently, the collector current in transistor Q12, approximately linearly varying by the product of absolute temperature and the input voltage $V_{IN}$ (referenced to a corresponding value of $V_{IN}$ equal 0), will provide a corresponding voltage drop across resistor $R_{80}$, imposing a corresponding ΔVBE between transistors Q81 and Q82.

$$V_{BE81} - V_{BE82} = V_T \ln\left(\frac{I_{C81}}{I_{C82}}\right) = -i_{PTAT}R_{80}C_5 V_{IN}$$

where $C_5$ is a constant

But $I_{PTAT}R_{80}$ is a voltage proportional to absolute temperature, or $$I_{PTAT}R_{80} = C_6 V_T$$

where $C_6$ is a constant.

Therefore $$V_T \ln\left(\frac{I_{Q81}}{I_{Q82}}\right) = -C_5 C_6 V_T V_{IN}$$

or:

$$I_{Q82} = I_{Q81} e^{C_4 V_{IN}}$$

But $I_{Q81}$ is proportional to absolute temperature. Thus this component, added to the current flowing through resistor $R_3$ and properly scaled, may be expressed as:

$$I_{Q82} = C_3 V_T e^{C_4 V_{IN}}$$

Consequently the gain control voltage $V_{AGC}$ for this embodiment is given by Equation 1, namely:

$$V_{AGC} = V_T(C_2 V_{IN} + C_3 e^{C_4 V_{IN}}) \qquad \text{Eq.(1)}$$

In the embodiments of the invention disclosed herein, two terms have been generated and added to provide a control for a current steered variable gain amplifier. One term approximates the desired log-linear response in the first portion of the range of the log-linear control, and a second term approximates the desired log-linear control in a second range of operation of the log-linear control. The circuits in the embodiments disclosed for accomplishing this comprise a first multiplier for providing a term approximately proportional to the input voltage times a term proportional to absolute temperature, and a second multiplier for providing a term proportional to the product of absolute temperature and an exponential term having an exponent proportional to the input voltage. In the embodiment of FIG. 5, the exponential term is also multiplied by the input voltage, wherein in the embodiment of FIG. 7 the exponential term is not multiplied by the input voltage, either one providing a close approximation to the desired log-linear response. In the case of FIG. 5, transistors Q1 through Q4 and Q7 and Q8 comprise one multiplier for multiplying the input voltage by a term proportional to absolute temperature. Transistors Q1 through Q4 and Q9 and Q10 comprise a second multiplier for providing a term approximately proportional to the product of the input voltage and absolute temperature, which term is converted to an exponential term having an exponent proportional to the input voltage and a coefficient proportional to the product of the input voltage and absolute temperature. These two terms are summed at the collectors of transistors Q7 and Q8 to provide the desired term control voltage $V_{AGC}$ ($V_{AGC}-$, $V_{AGC}+$). FIG. 6 is functionally similar to FIG. 5, with FIG. 7 presenting a circuit for an embodiment similar to that of FIGS. 5 and 6, with the exception that the exponential term is merely an exponential term having an exponent proportional to the input voltage and a coefficient proportional to absolute temperature. of course, other circuits may be used to provide two or more terms which, when summed together, provide the desired approximate log-linear control for current steered variable gain amplifiers. Thus, while certain embodiments of the present invention have been disclosed and described herein, it will be understood by those skilled in the art that various changes in form and detail may be made therein without departing from the spirit and scope of the invention.

What is claimed is:

1. A log linear variable gain amplifier control apparatus for providing a differential automatic gain control signal for a current steered variable gain amplifier comprising:

a first circuit responsive to an input signal $V_{IN}$;

a second circuit responsive to the first circuit providing a first component of the differential automatic gain control signal approximately proportional to the product of $V_{IN}$ and absolute temperature;

a third circuit responsive to the first circuit providing a second component of the differential automatic gain control signal approximately proportional to the product of absolute temperature, the input voltage $V_{IN}$ and $e^{V_{IN}}$;

the first and second components of the differential automatic gain control signal each having a weighting coefficient to provide a current steered variable gain amplifier with a gain having an approximately linear variation of gain in decibels in relation to the input signal $V_{IN}$.

2. The log linear variable gain amplifier control apparatus of claim 1 wherein the first circuit comprises first and second transistors of substantially equal size, each transistor having an emitter, a base and a collector, the voltage between the base and the emitter of each transistor controlling the current through the transistor, the difference in current through the first and second transistors being proportional to the input voltage, the emitters of the first and second transistors being coupled together, the voltages on the bases of the first and second transistors being coupled to the second and third circuits.

3. The log linear variable gain amplifier control apparatus of claim 2 wherein the second circuit comprises third and fourth transistors of substantially equal size, each of the third and fourth transistors having an emitter, a base and a collector, the voltage between the base and the emitter of each transistor controlling the current through the transistor, the emitters of the third and fourth transistors being coupled together, the total current through the third and fourth transistors being proportional to absolute temperature, the bases of the third and fourth transistors being coupled to the bases of the first and second and transistors, respectively.

4. The log linear variable gain amplifier control apparatus of claim 3 wherein the third circuit comprises fifth and sixth transistors of substantially unequal size, and seventh and eighth transistors, and a resistor, each of the fifth, sixth, seventh and eighth transistors having an emitter, a base and a collector, the voltage between the base and the emitter of each transistor controlling the current through the transistor;

the emitters of the fifth and sixth transistors being coupled together, the total current through the fifth and sixth transistors being proportional to absolute temperature, the bases of the fifth and sixth transistors being coupled to the bases of the first and second transistors, respectively;

the bases of the seventh and eighth transistors being coupled together and to the collector of the seventh transistor, the emitter of the seventh transistor being coupled to the resistor and the resistor being coupled to the emitter of the eighth transistor so that the base emitter voltage of the seventh transistor plus the voltage drop across the resistor is equal to the base emitter voltage of the eighth transistor.

9

5. The log linear variable gain amplifier control apparatus of claim 4 further comprised of second and third transistors, the collectors of the third and fourth transistors being coupled to the second and third resistors, respectively, the collector of the eighth transistor being coupled to the collector or the third transistor.

6. A log linear variable gain amplifier control apparatus for providing a differential automatic gain control signal for a current steered variable gain amplifier comprising:

a first circuit responsive to an input signal $V_{IN}$;

a second circuit responsive to the first circuit providing a first component of the differential automatic gain control signal approximately proportional to the product of $V_{IN}$ and absolute temperature;

a third circuit responsive to the first circuit providing a second component of the differential automatic gain control signal approximately proportional to the product of absolute temperature and $e^{V_{IN}}$;

the first and second components of the differential automatic gain control signal each having a weighting coefficient to provide a current steered variable gain amplifier with a gain having an approximately linear variation of gain in decibels in relation to the input signal $V_{IN}$.

7. The log linear variable gain amplifier control apparatus of claim 6 wherein the first circuit comprises first and second transistors of substantially equal size, each transistor having an emitter, a base and a collector, the voltage between the base and the emitter of each transistor controlling the current through the transistor, the difference in current through the first and second transistors being proportional to the input voltage, the emitters of the first and second transistors being coupled together, the voltages on the bases of the first and second transistors being coupled to the second and third circuits.

8. The log linear variable gain amplifier control apparatus of claim 7 wherein the second circuit comprises third and fourth transistors of substantially equal size, each of the third and fourth transistors having an emitter, a base and a collector, the voltage between the base and the emitter of each transistor controlling the current through the transistor, the emitters of the third and fourth transistors being coupled together, the total current through the third and fourth transistors being proportional to absolute temperature, the bases of the third and fourth transistors being coupled to the bases of the first and second and transistors, respectively.

9. The log linear variable gain amplifier control apparatus of claim 8 wherein the third circuit comprises fifth and sixth transistors and a resistor, each of the fifth and sixth transistors having an emitter, a base and a collector, the voltage between the base and the emitter of each transistor controlling the current through the transistor;

the emitters of the fifth and sixth transistors being coupled together, the current through the fifth transistor being proportional to absolute temperature, the bases of the fifth and sixth transistors being coupled together through the resistor, the base of the fifth transistor being coupled to receive a current proportional to the current in the first transistor times absolute temperature.

10. The log linear variable gain amplifier control apparatus of claim 9 further comprised of second and third transistors, the collectors of the third and fourth transistors being coupled to the second and third resistors, respectively, the collector of the sixth transistor being coupled to the collector or the third transistor.

10

11. A log linear current steered variable gain amplifier comprising:

a first circuit responsive to an input signal $V_{IN}$;

a second circuit responsive to the first circuit providing a first control signal component which, when applied as a control to a current steered variable gain amplifier, will approximate the output current $I_{OUT}= I_{signal}C_1 e^{C_2 V_{IN}}$ for small values of the input signal $V_{IN}$;

a third circuit responsive to the first circuit providing a second control signal component which, when applied as a control to a current steered variable gain amplifier, will approximate the output current $I_{OUT}= I_{signal}C_1 e^{C_2 V_{IN}}$ for larger values of the input signal $V_{IN}$;

the first and second components of the differential automatic gain control signal each having a weighting coefficient to provide a current steered variable gain amplifier with a gain having an approximately linear variation of gain in decibels in relation to the input signal $V_{IN}$;

a differential pair of transistors coupled to form a current steered variable gain amplifier; and, a fourth circuit combining the first and second components of the differential automatic gain control signal and applying the combined signals to the differential pair of transistors.

12. The log linear current steered variable gain amplifier of claim 11 wherein the first circuit provides a first control signal component approximately proportional to the product of $V_{IN}$ and absolute temperature.

13. The log linear current steered variable gain amplifier of claim 12 wherein the second circuit provides a second control signal component approximately proportional to the product of absolute temperature, the input voltage $V_{IN}$ and $e^{V_{IN}}$.

14. The log linear current steered variable gain amplifier of claim 12 wherein the second circuit provides a control signal component approximately proportional to the product of absolute temperature and $e^{V_{IN}}$.

15. A method of providing a current steered variable gain amplifier having an output current $I_{OUT}$ responsive to an input voltage $V_{IN}$ in the approximate form $I_{OUT}= I_{signal}C_1 e^{C_2 V_{IN}}$ comprising:

generating a first control signal component which, when applied as a control to a current steered variable gain amplifier, will approximate the output current $I_{OUT}= I_{signal}C_1 e^{C_2 V_{IN}}$ for small values of the input signal $V_{IN}$;

generating a second control signal component which, when applied as a control to a current steered variable gain amplifier, will approximate the output current $I_{OUT}=I_{signal}C_1 e^{C_2 V_{IN}}$ for larger values of the input signal $V_{IN}$;

applying the first and second control signal components to control a current steered variable gain amplifier.

16. The method of claim 15 wherein the first control signal component is approximately proportional to the product of $V_{IN}$ and absolute temperature.

17. The method of claim 16 wherein the second control signal component is approximately proportional to the product of absolute temperature, the input voltage $V_{IN}$ and $E^{V_{IN}}$.

18. The method of claim 16 wherein the second control signal component is approximately proportional to the product of absolute temperature and $e^{V_{IN}}$.

* * * * *